United States Patent
Laurino et al.

(10) Patent No.: US 9,423,417 B2
(45) Date of Patent: *Aug. 23, 2016

(54) VOLTAGE TESTER HAVING ALTERNATIVELY ATTACHABLE OR SEPARABLE PROBES

(75) Inventors: Ferdinand Laurino, Seattle, WA (US); Jeff Worones, Seattle, WA (US)

(73) Assignee: Fluke Corporation, Everett, WA (US)

(*) Notice: Subject to any disclaimer, the term of this patent is extended or adjusted under 35 U.S.C. 154(b) by 736 days.

This patent is subject to a terminal disclaimer.

(21) Appl. No.: 13/271,499

(22) Filed: Oct. 12, 2011

(65) Prior Publication Data

US 2013/0093449 A1   Apr. 18, 2013

(51) Int. Cl.
*G01R 1/06* (2006.01)
*G01R 1/04* (2006.01)
*G01R 1/067* (2006.01)
*G01R 19/155* (2006.01)

(52) U.S. Cl.
CPC .............. *G01R 1/04* (2013.01); *G01R 1/06788* (2013.01); *G01R 19/155* (2013.01)

(58) Field of Classification Search
None
See application file for complete search history.

(56) References Cited

U.S. PATENT DOCUMENTS

| | | | |
|---|---|---|---|
| 2,791,748 A | 5/1957 | Mitchell | |
| 2,842,741 A | 7/1958 | Simkins | |
| 3,555,420 A | 1/1971 | Schwartz | |
| 4,079,314 A | 3/1978 | Jone | |
| 4,152,639 A | 5/1979 | Chaffee | |
| 4,259,635 A | 3/1981 | Triplett | |
| 4,298,837 A | 11/1981 | Koslar | |
| 4,476,721 A | 10/1984 | Hochreuther et al. | |
| 4,696,189 A | 9/1987 | Hochreuther | |
| 5,029,296 A * | 7/1991 | Shang-Wen | 324/72.5 |
| D337,281 S * | 7/1993 | Bohmer et al. | D10/80 |
| 5,250,893 A * | 10/1993 | Gambill et al. | 324/115 |
| 5,448,162 A | 9/1995 | Beha | |
| 5,481,185 A | 1/1996 | Lane et al. | |
| 5,543,707 A * | 8/1996 | Yoneyama et al. | 324/115 |
| 6,137,285 A | 10/2000 | Walsten et al. | |
| 6,525,665 B1 * | 2/2003 | Luebke et al. | 340/635 |
| 6,605,934 B1 | 8/2003 | Campbell et al. | |
| 7,242,173 B2 | 7/2007 | Cavoretto | |

(Continued)

FOREIGN PATENT DOCUMENTS

| | | |
|---|---|---|
| CN | 1116605 A | 2/1996 |
| DE | 3125552 C1 | 11/1982 |

(Continued)

OTHER PUBLICATIONS

EP 2 581 750 A1 "Voltage tester having alternatively attachable or separable probes" by Laurino et al. 2013.*

(Continued)

*Primary Examiner* — Paresh Patel
(74) *Attorney, Agent, or Firm* — Seed IP Law Group LLC (57) ABSTRACT

A tester includes a main body and a removable probe. The main body includes a main body probe and a front panel including selectable options for selecting a tester function. The removable probe may be coupled to the main body via a cord. The removable probe is fixable to the main body via a latch assembly. The latch assembly includes a socket disposed on one of the removable probe or the main body and a mating protrusion disposed at the other of the removable probe or the main body.

22 Claims, 9 Drawing Sheets

(56) References Cited

U.S. PATENT DOCUMENTS

| | | | |
|---|---|---|---|
| 7,304,618 B2 * | 12/2007 | Plathe | G01R 1/04 324/111 |
| 7,741,835 B2 | 6/2010 | Tan | |
| 7,746,051 B1 | 6/2010 | Buchanan | |
| 9,030,220 B2 * | 5/2015 | Laurino | G01R 1/04 324/72.5 |
| 2006/0043959 A1 | 3/2006 | Cavoretto | |
| 2009/0146644 A1 | 6/2009 | Tan et al. | |
| 2009/0185597 A1 | 7/2009 | Khan et al. | |
| 2009/0189597 A1 | 7/2009 | Lagerberg | |
| 2011/0309853 A1 | 12/2011 | Tan | |

FOREIGN PATENT DOCUMENTS

| | | | |
|---|---|---|---|
| DE | 29815829 U1 | | 3/1999 |
| DE | 202010015761 A1 | | 1/2011 |
| DE | 102011077007 A1 | * | 12/2012 |
| EP | 1164379 A1 | | 12/2001 |
| GB | 1565218 A | | 4/1980 |

OTHER PUBLICATIONS

EP 2 581 749 A1 "Voltage tester having alternatively attachable or separable probes" by Laurino et al. 2013.*

Extended European Search Report and Written Opinion from corresponding European Patent Application No. 12173246.5.

Fluke Model T50 Voltage/Continuity Tester Users Manual, PN2438510, May 2005.

Fluke Model T100, T120, T140, VDE Voltage/Continuity Tester Users Manual, Nov. 2006.

Search Report and Written Opinion for European patent application No. 12172994.1 mailed Jan. 4, 2013 (which corresponds to U.S. Appl. No. 13/271,297, filed Oct. 12, 2011).

Application papers for U.S. Appl. No. 13/271,297, filed Oct. 12, 2011.

Chinese Office Action date Jul. 3, 2014, in Chinese Patent Application No. CN 201210370035.5, filed Sep. 27, 2012, 19 pages.

Chinese Office Action dated Sep. 3, 2014, in Chinese Application 201210278227.3, filed Aug. 7, 2012, 23 pages.

* cited by examiner

VOLTAGE TESTER HAVING ALTERNATIVELY ATTACHABLE OR SEPARABLE PROBES

BACKGROUND OF THE INVENTION

The present invention relates generally to handheld voltage and continuity testers. More particularly, the invention relates to a handheld voltage and continuity tester having an improved structure for the meter case such that the probes are alternately attachable in fixed positions relative to one another or separable from each other.

Handheld voltage testers support testing and measurement in multiple handicraft and industrial applications, as well as household uses. These testers often provide a device that is relatively easy to use and handle in order to perform voltage testing and, in some cases, continuity or resistance.

Some handheld voltage testers are configured as units having two probes. In some cases, one probe may be provided on a main body and the other probe may be connected to the main body via a cord. Although some snap connections have been developed to enable the probes to be held together when not in use, these connections are typically not very robust. Accordingly, the probes may be unwieldy to handle or difficult to manage in some situations.

SUMMARY OF THE INVENTION

According to one example embodiment, a tester is provided. The tester includes a main body and a removable probe. The main body includes a main body probe and a front panel including selectable options for selecting a tester function. The removable probe may be coupled to the main body via a cord. The removable probe is fixable to the main body via a latch assembly. The latch assembly includes a socket disposed on one of the removable probe or the main body and a mating protrusion disposed at the other of the removable probe or the main body.

In some example embodiments, the front panel includes a readout panel comprising a series of lights that selectably provide backlight to numbered values defined on the readout panel based on readings measured using the main body probe and the removable probe. In some cases, the front panel and the removable probe each include test feature buttons selectable to initiate test procedures.

Exemplary embodiments are contemplated in which the mating protrusion comprises an arcuate groove disposed around at least two sides of a base thereof to form cantilevered extension portions that at least extend along a longitudinal length of the main body. In some embodiments, the socket comprises a right side sheath body and a left side sheath body that each extend from opposite sides of the socket outward away from the removable probe and then fold toward each other to define a receiving space in the socket to receive the mating protrusion.

In some example embodiments, the removable probe further comprises an alignment ridge disposed proximate to the socket. The alignment ridge may extend radially outward from the removable probe in a plane substantially perpendicular to a longitudinal axis of the removable probe. The alignment ridge may include a flat surface configured to abut a mating surface disposed proximate to the mating protrusion on the main body.

An additional example embodiment may include the main body having a probe support ridge extending radially outward from at least a portion of the main body and lying in a plane that is substantially perpendicular to a longitudinal axis of the main body. In some embodiments, the probe support ridge extends at least over a back panel of the main body and a side panel of the main body that is proximate to the removable probe when the removable probe is fixed to the main body via the latch assembly. In an example embodiment, the probe support ridge comprises a cradle portion shaped to support a back portion of the removable probe when the removable probe is fixed to the main body via the latch assembly.

In some cases, each of the removable probe and the main body probe include corresponding lead tips, and the lead tips of the removable probe and the main body probe may be substantially even in a longitudinal direction when the removable probe is fixed to the main body via the latch assembly. In an example embodiment, each of the removable probe and the main body probe include corresponding lead tips, and the lead tips of the removable probe and the main body probe are disposed a predetermined distance from each other when the removable probe is fixed to the main body via the latch assembly. In some situations, the predetermined distance corresponds to a distance between receptacle slots for receiving power plugs.

According to another aspect, an example embodiment provides a method of assembling a tester. The method may include providing a main body including a main body probe and a front panel including selectable options for selecting a tester function, coupling a removable probe to the main body via a cord, and providing a latch assembly to enable fixing the removable probe to the main body. The latch assembly may include a socket disposed on one of the removable probe or the main body and a mating protrusion disposed at the other of the removable probe or the main body. In some embodiments, providing the latch assembly further comprises providing the mating protrusion to include an arcuate groove disposed around at least two sides of a base thereof to form cantilevered extension portions that at least extend along a longitudinal length of the main body. In an example embodiment, providing the latch assembly further comprises providing the socket to include a right side sheath body and a left side sheath body that each extend from opposite sides of the socket outward away from the removable probe and then fold toward each other to define a receiving space in the socket to receive the mating protrusion.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

Figure 1:
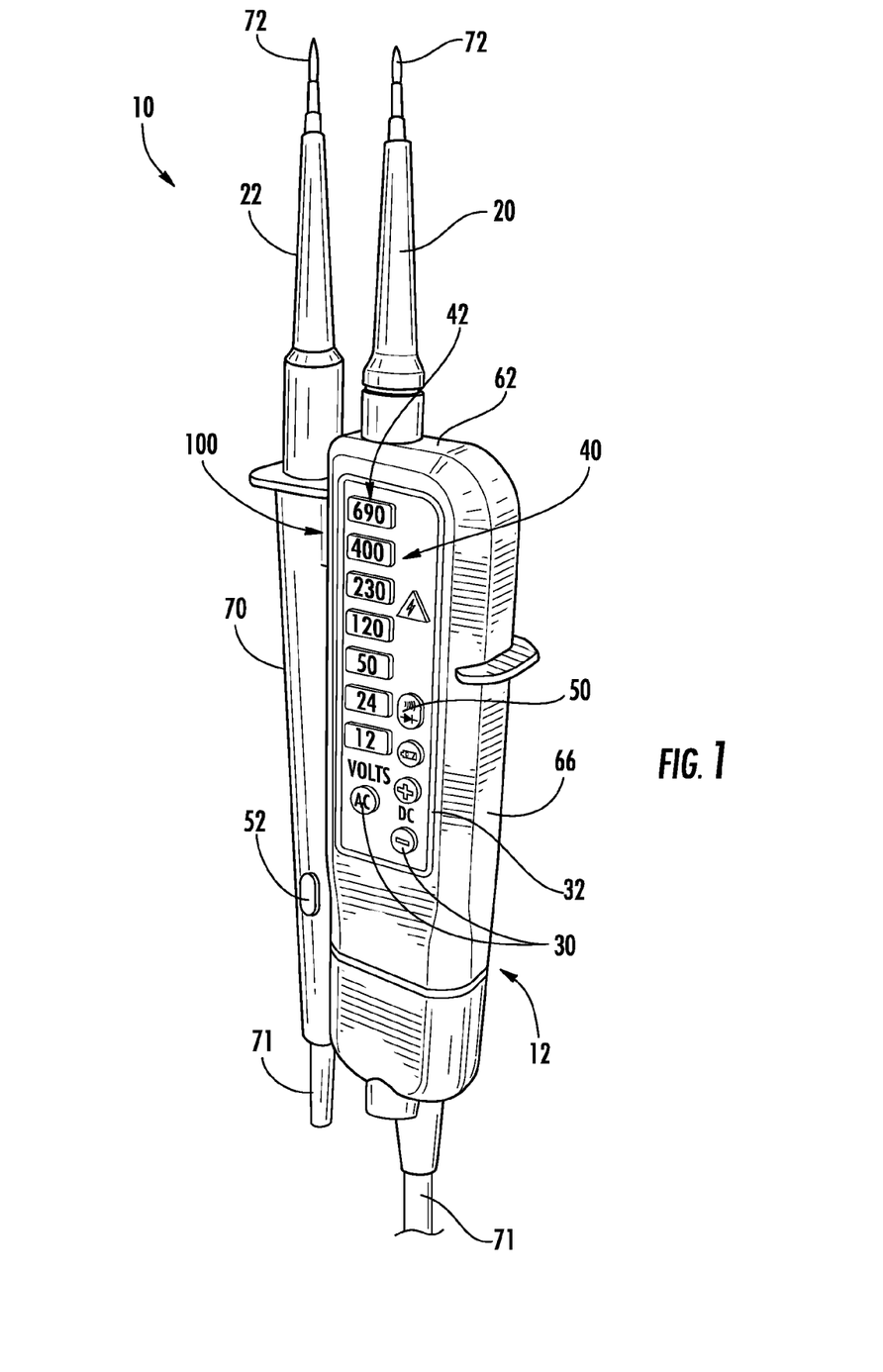
FIG. 1 is a perspective view of a voltage tester constructed in accordance with the present invention.

FIG. 1 illustrates a voltage and continuity tester 10 constructed in accordance with the present invention. FIGS. 2-8 illustrate various alternative views of the tester 10. Referring now to FIGS. 1-8, tester 10 comprises a main body 12 and two probes including a main body probe 20 and a removable probe 22. The main body 12 may house circuitry for driving the various functions of the tester 10. For example, the circuitry may enable the tester 10 to function to measure one or more of AC voltage, DC voltage, resistance and/or continuity based on functional options that may be selected using any of various function selector buttons 30 that may be disposed on a front panel 32 of the tester 10. Accordingly, if an operator selects a function selector button corresponding to DC volts, the tester may function as a DC voltmeter and corresponding circuitry for supporting such functionality may be communicatively coupled to the main body probe 20 and the removable probe 22 to support taking DC voltage readings. Similarly, if the operator selects a function selector button corresponding to AC volts, the tester may function as an AC voltmeter and corresponding circuitry for supporting such functionality may be communicatively coupled to the main body probe 20 and the removable probe 22 to support taking AC voltage readings.

Figure 3:
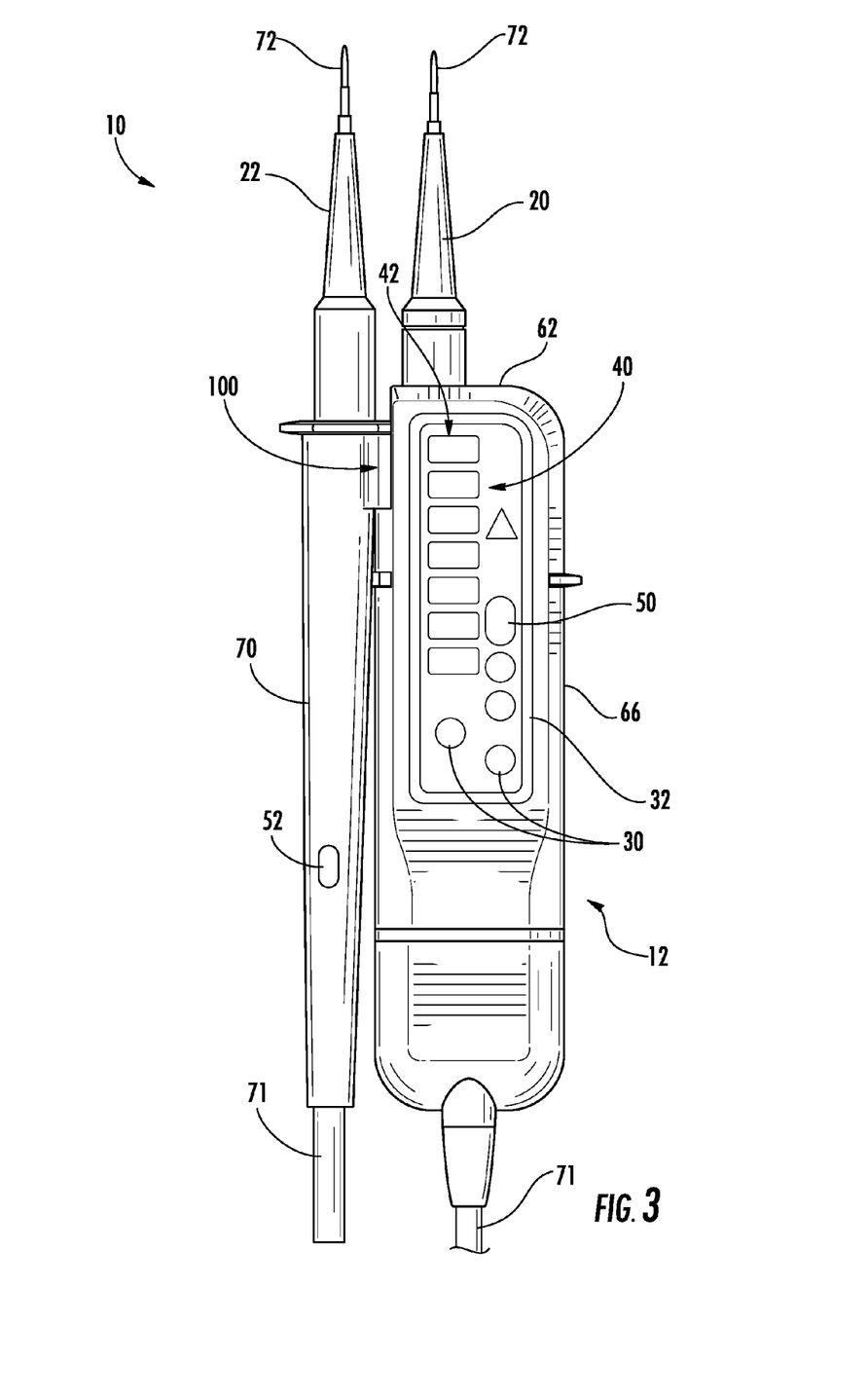
FIG. 3 is a front plan view of the voltage tester of FIG. 1.

In an example embodiment, the front panel 32 may also include a readout panel 40. The readout panel 40 may include a series of lights 42, each of which may be lit based on the values read by the probes of the tester for the selected function. Accordingly, each light in the series of lights 42 may correspond to a specific value such that, if a threshold reading is received, the corresponding light may be lit. In some embodiments, the series of lights 42 may be provided behind corresponding values that may be printed on the readout panel 40 for each respective light. As such, the readout panel 40 may include a series of backlit values that may define a range of sequentially arranged values. The lighting of one of the lights in the series of lights 42 may then provide backlight to make the corresponding value visible or highlighted so that the operator may recognize the reading provided thereby. By providing the series of lights 42 in a backlit configuration relative to the corresponding printed values for each light, it may be easier for the operator to determine the reading than, for example, situations where a light is disposed next to a printed value.

In some embodiments, each of the selector buttons 30 may be a selectable key disposed in the front panel 32 and pressing a key may cause an input to be communicated correspondingly to the tester's printed circuit board (located inside the main body 12). The printed values of the readout panel 40 may, in some cases, be printed on translucent coverings that may extend through apertures in the front panel 32. However, in some cases, the printed values may be provided on a translucent sheet that may cover at least the readout panel 40 or perhaps an entirety or substantial portion of the front panel 32. Lights associated with the series of lights 42 may be associated with respective apertures corresponding to each printed value. In some embodiments, the lights may be light emitting diodes (LEDs) or other light sources.

In an example embodiment, the front panel 32 may also include one or more buttons (e.g., test initiator 50) associated with test functions that enable the circuitry within the main body 12 to perform desirable or required (e.g., based on local regulations) testing. In an example embodiment, a test button 52 may be provided also or alternatively on the removable probe 22. In some cases, testing may require simultaneous activation of the test initiator 50 and/or the test button 52.

Figure 2:
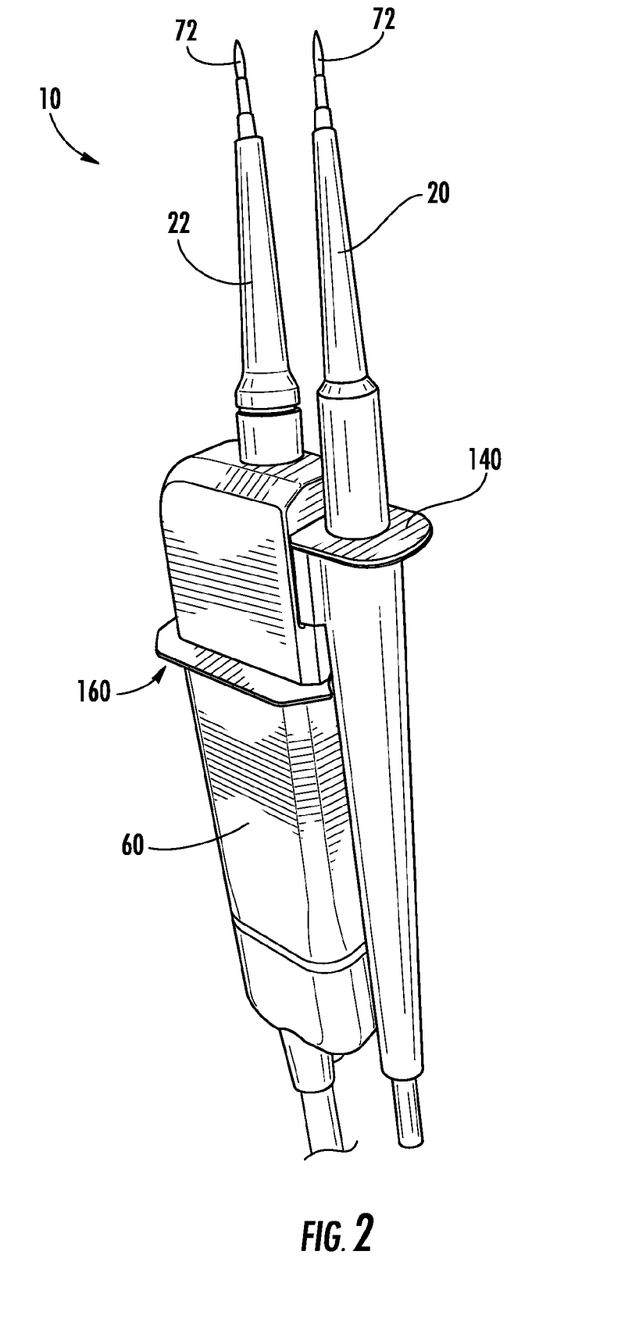
FIG. 2 is perspective view showing the back side and certain other parts of the voltage tester of FIG. 1.

In an example embodiment, the main body 12 may include the front panel 32, a back panel 60, a top panel 62, a bottom panel 64, a right side panel 66 and a left side panel 68. Each of the panels may be joined together to define a casing to house the circuitry within the main body 12. In some embodiments, the main body probe 20 may extend out on one of the longitudinal ends of the main body 12 (e.g., the top panel 62). The bottom panel 64 may include corded connection to a bottom portion of a probe body 70 of the removable probe 22 via a cord (portions of which are show as cord 71). The main body probe 20 and the removable probe 22 may each include lead tips 72 at distal ends thereof.

Figure 9:
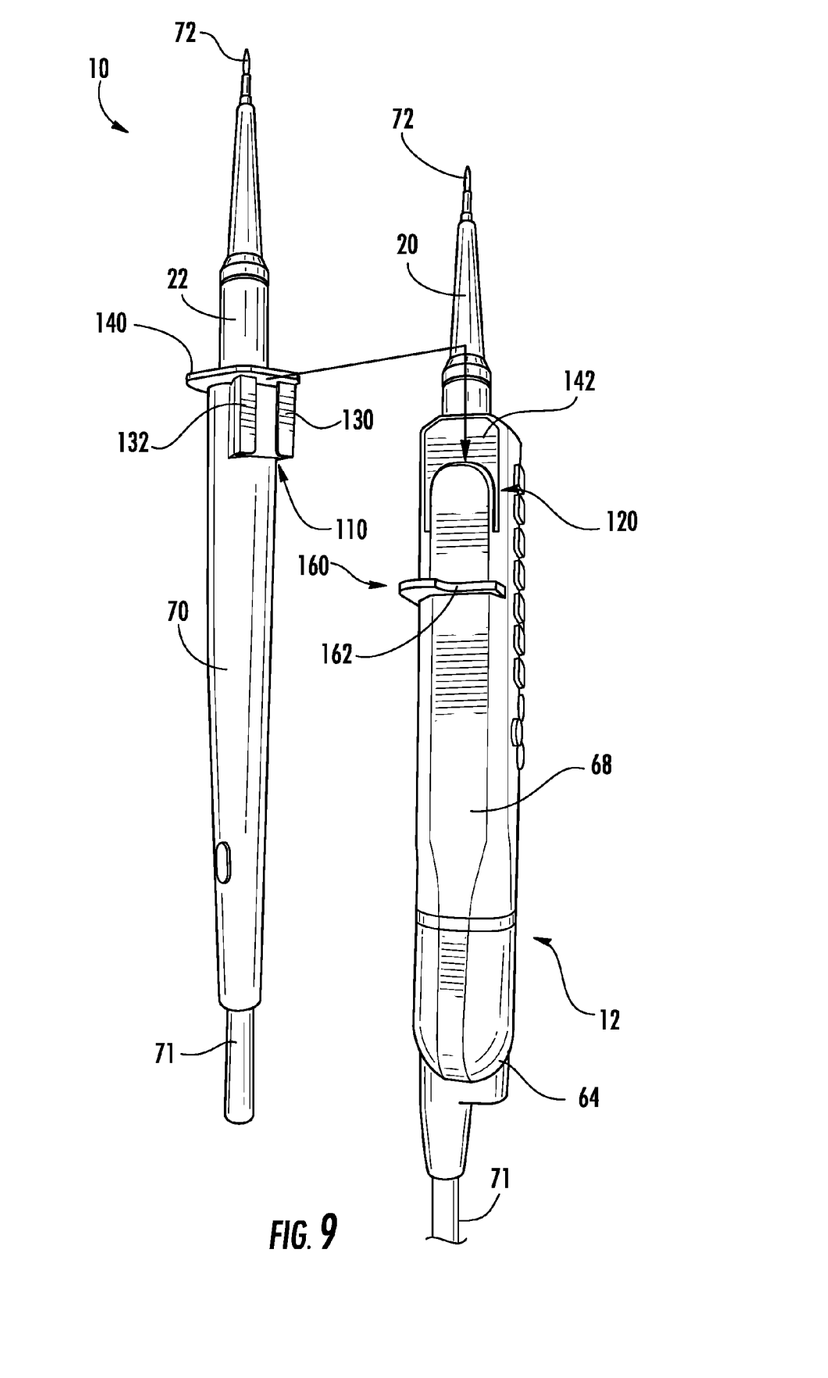
FIG. 9 is a perspective view showing a removable probe connector of the voltage tester according to an example embodiment.
Figure 10:
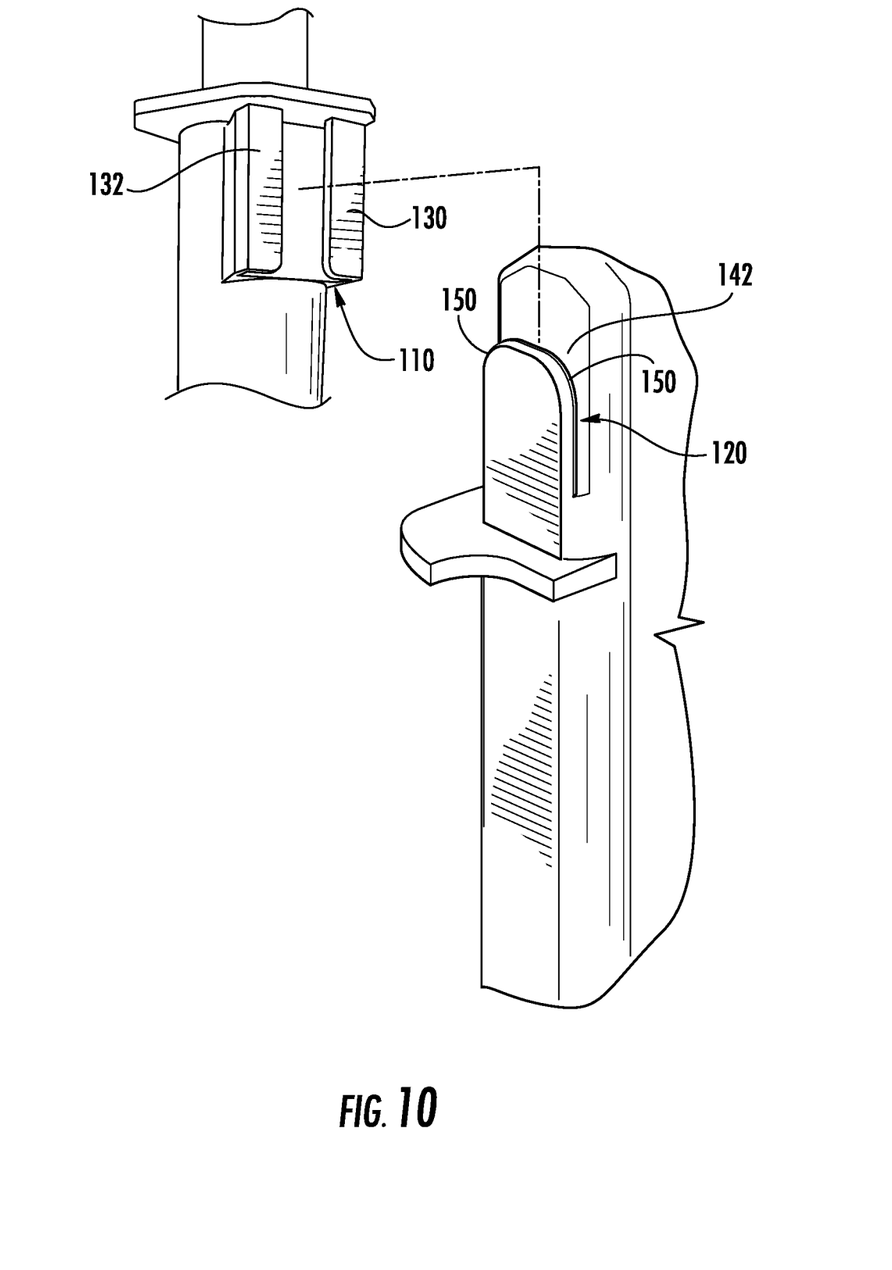
FIG. 10 is a perspective view showing a latch assembly of the voltage tester according to an example embodiment.

Referring now also to FIGS. 9 and 10, the main body probe 20 and the removable probe 22 may be connectable to each other via a latch assembly 100. In an example embodiment, portions of the latch assembly 100 that are located on the removable probe 22 may be disposed at a right side portion of the probe body 70 and portions of the latch assembly 100 that are located on the main body 12 may be disposed at the left side panel 68. However, it should be appreciated that the sides could be switched in some alternative embodiments.

The latch assembly 100 may include a socket 110 configured to receive a mating protrusion 120. In an example embodiment, the socket 110 may be open at one end to receive the mating protrusion 120 via insertion of the mating protrusion 120 into the socket 110 along a direction that is parallel to a longitudinal length of both the main body probe 20 and the removable probe 22. As such, for example, longitudinal lengths of the main body probe 20 and the removable probe 22 may be aligned with each other such that the mating protrusion 120 is disposed proximate to the open end of the socket 110. The mating protrusion 120 may then be slid into the socket 110 to affix the removable probe 22 and the main body probe 20 in position relative to one another.

In an example embodiment, the socket 110 may be disposed on the probe body 70 and the mating protrusion 120 may be disposed on the main body 12 as shown in FIGS. 9 and 10. However, in alternative embodiments, the mating protrusion 120 may be disposed on the probe body 70 and the socket 110 may be disposed on the main body 12. In some embodiments, the socket 110 may include at least a right side sheath body 130 and a left side sheath body 132 that may each extend from opposite sides of the socket 110 outward away from the probe body 70 and then fold toward each other to define a receiving space in the socket 110 to receive the mating protrusion 120. As such, the right side sheath body 130 and the left side sheath body 132 may form a void space that substantially matches a shape of the mating protrusion 120 in some cases. In this regard, mating protrusion 120 may have a T-shaped configuration in which a top planar element is spaced from the main body 12 by a narrower spacer element. The spacer element may have a width slightly less than the gap between right side sheath body 130 and left side sheath body 132. However, it will be appreciated that an exact match of shapes is not required.

In some embodiments, one longitudinal end of the socket 110 may be proximate to an alignment ridge 140. In an example embodiment, the alignment ridge 140 may be disposed on the probe body 70 and may extend radially outward from the probe body 70 to define a ridge (i.e., flange) that lies in a plane that is substantially perpendicular to the longitudinal axis of the removable probe 22. At least a portion of the alignment ridge 140 may be shaped to support rigid connection between the removable probe 22 and the main body probe 20 when the mating protrusion 120 is inserted into the socket 110. In this regard, for example, the alignment ridge 140 may include an edge that is flat and fits snugly against a mating surface 142 of the left side panel 68 of the main body probe 12 proximate to the mating protrusion 120. In some cases, the alignment ridge 140 may also function to guard the user's hand from sliding up the removable probe 22.

As noted above, mating protrusion 120 may be configured having a top planar element spaced from main body 12 by a narrower spacer element. Stated another way, the mating protrusion 120 may include cantilevered extension portions 150 that extend from at least two sides (and in some embodiments three sides) of the mating protrusion 120 in order to slide into the socket 110 and engage respective ones of the right side sheath body 130 and the left side sheath body 132. The mating protrusion 120 may otherwise be an extension of the left side panel 68 of the main body 12 that extends in a cantilevered fashion over a portion of the mating surface 142 due to the recess formed by surface 142. The cantilevered extension portions 150 may include two portions that extend along a longitudinal length of the main body 12 to correspond to the right side sheath body 130 and the left side sheath body 132 when the mating protrusion 120 is inserted into the socket 110. In some embodiments, a third portion of the cantilevered portions 150 may extend between the two portions that extend along a longitudinal length of the main body 12 and may contact or otherwise be proximate to at least a portion of the alignment ridge 140 when the mating protrusion 120 is inserted into the socket 110. A distance between the folded portion of the right and left side sheath bodies 130 and 132 may be slightly larger than a width of the material forming the cantilevered extension portions 150. As such, the mating protrusion 120 may include an arcuate groove around at least two sides of a base thereof to form the cantilevered extension portions 150.

To further stabilize the removable probe 22 when mated with the main body 12, the main body 12 may include a probe support ridge 160. The probe support ridge 160 may extend radially outward from at least a portion of the main body 12 and lie in a plane that is substantially perpendicular to the longitudinal axis of the main body 12. In an example embodiment, the probe support ridge 160 may extend over portions of the right side panel 66, the left side panel 68 and the back panel 60 (see FIGS. 7 and 8). However, the probe support ridge 160 could be less extensive in some examples.

In an example embodiment, the probe support ridge 160 may include a cradle portion 162 shaped to fit the probe body 70 when the mating protrusion 120 is inserted into the socket 110. The cradle portion 162 may be shaped such that a portion of the probe support ridge 160 contacts and supports a back side of the probe body 70 when the removable probe 20 is mated with the main body 12. As such, the cradle portion 162 includes one portion that contacts a right side of the probe body 70 and another portion that simultaneously contacts a back side portion of the probe body 70 when the removable probe 20 is mated with the main body 12 by insertion of the mating protrusion 120 into the socket 110.

Figure 4:
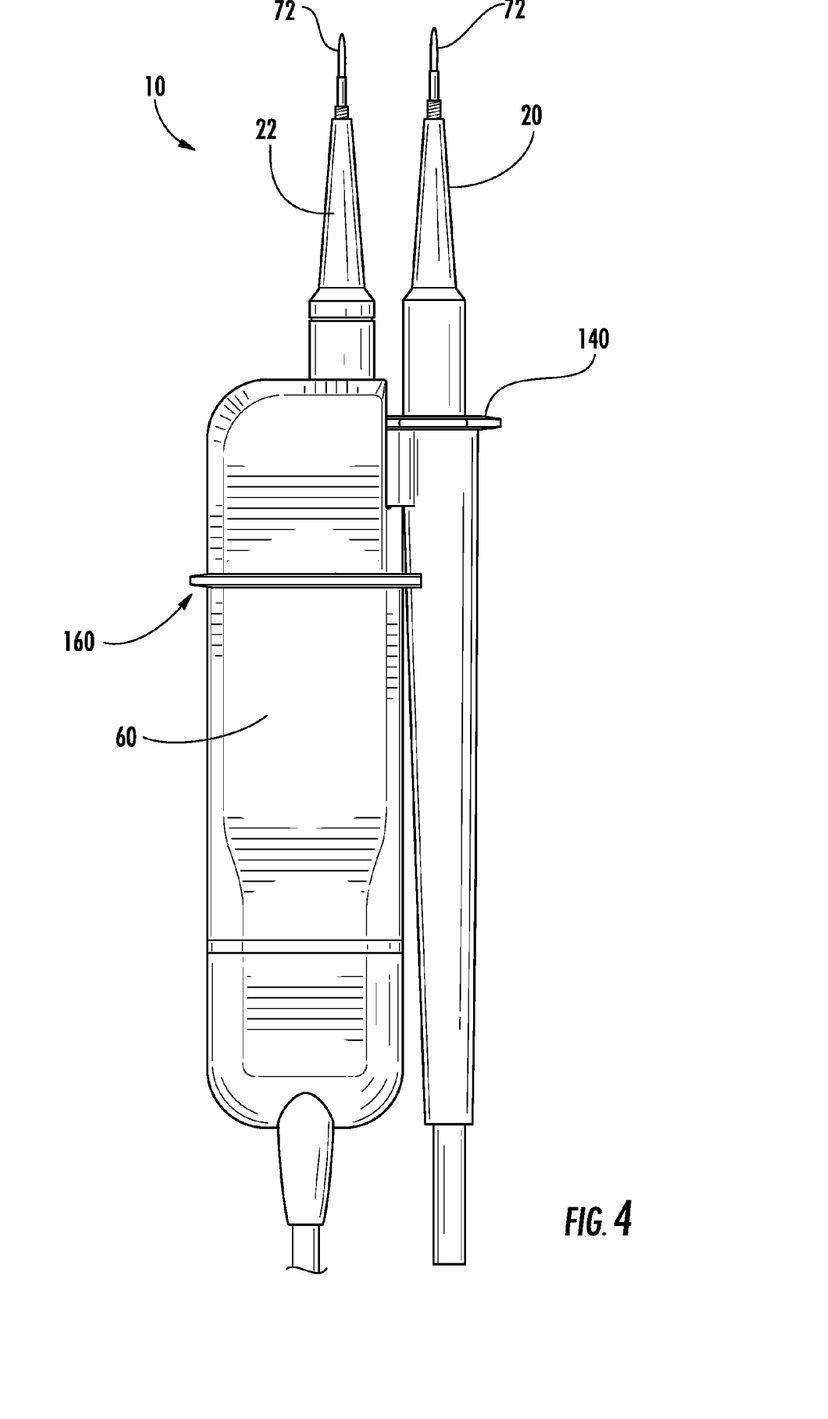
FIG. 4 is a back plan view of the voltage tester of FIG. 1.
Figure 5:
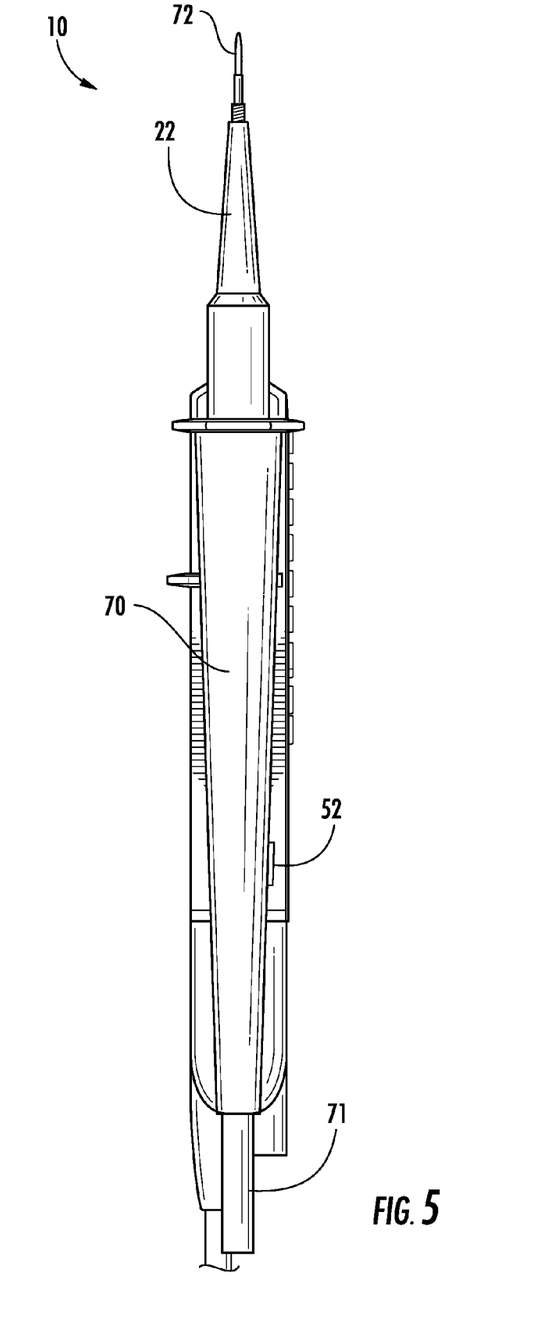
FIG. 5 is a left side plan view of the voltage tester of FIG. 1.
Figure 6:
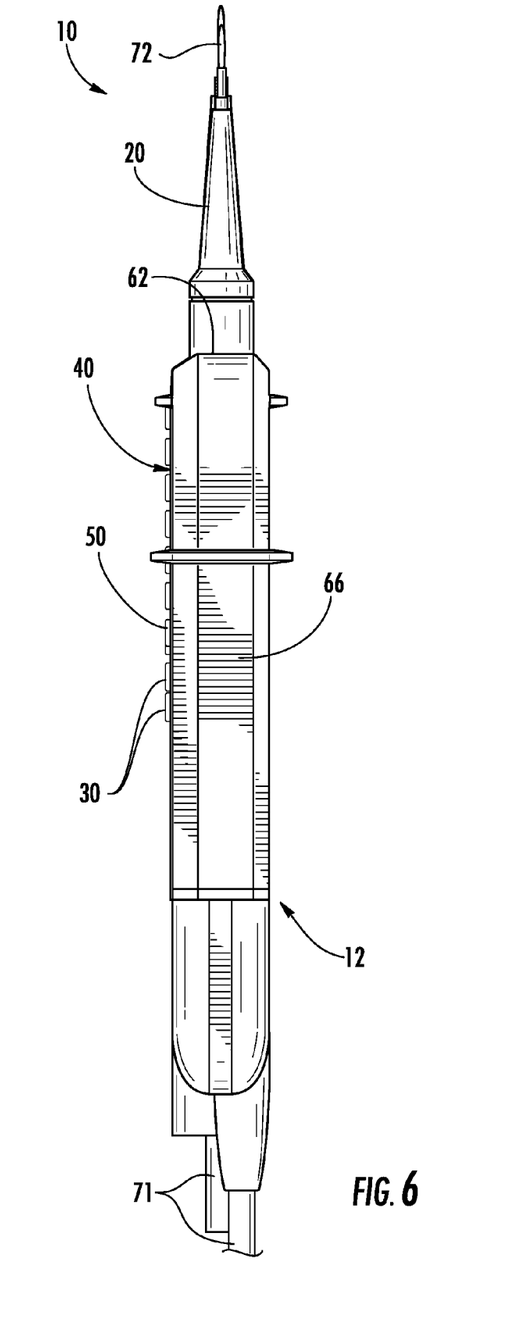
FIG. 6 is a right side plan view of the voltage tester of FIG. 1.
Figure 7:
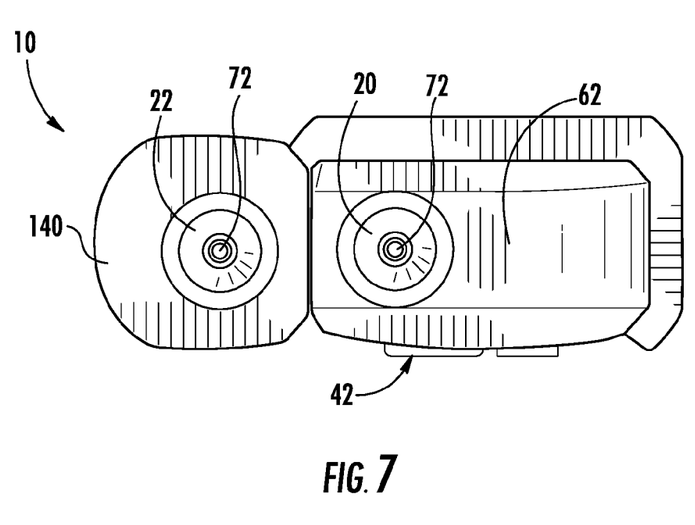
FIG. 7 is a top plan view of the voltage tester of FIG. 1.
Figure 8:
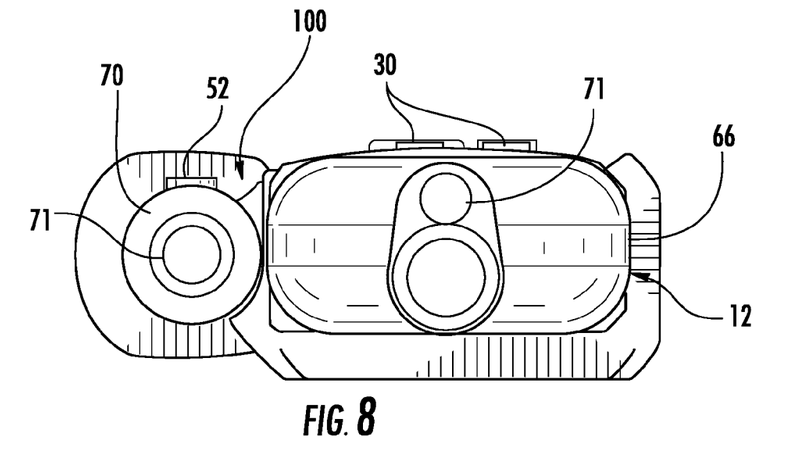
FIG. 8 is a bottom plan view of the voltage tester of FIG. 1.

In some embodiments, a length of the removable probe 22 and the main body probe 20 may be equal. In an example embodiment, the latch assembly 100 may be configured in such a way that when the mating protrusion 120 is inserted into the socket 110, the lead tips 72 are substantially even (i.e., axially aligned) with each other as shown in FIGS. 3 and 4. Moreover, the latch assembly 100 may be configured in such a way that when the mating protrusion 120 is inserted into the socket 110, the lead tips 72 are spaced apart from each other by a predetermined distance. For example, the predetermined distance may be a standard distance between receptacle slots for receiving power plugs. Example embodiments may therefore provide a firm connection between the removable probe 22 and the main body probe 20 and also meet various standard arrangements and testing requirements.

It can thus be seen that the present invention provides a tester having alternately attachable or separable probes. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A tester comprising:
   a main body including a main body probe and a front panel including selectable options for selecting a tester function; and
   a removable probe having a probe body that extends between a bottom portion and a lead tip at an opposite distal end of the removable probe, wherein the bottom portion is coupled to the main body via a cord that electrically couples the lead tip to circuitry in the main body, the probe body surrounding the electrical coupling between the lead tip and the cord,
   wherein the removable probe is fixable to the main body via a latch assembly, the latch assembly including a socket disposed on one of the removable probe or the main body and a mating protrusion disposed on the other of the removable probe or the main body, the mating protrusion extending laterally outward from a portion of a side of the probe body of the removable probe or the main body toward the socket and being insertable into the socket via motion in a direction parallel to a longitudinal length of the main body.

2. The tester of claim 1, wherein the front panel includes a readout panel comprising a series of lights that selectably provide backlight to numbered values defined on the readout panel based on readings measured using the main body probe and the removable probe.

3. The tester of claim 1, wherein the front panel and the removable probe each include test feature buttons selectable to initiate test procedures.

4. The tester of claim 1, wherein the mating protrusion comprises an arcuate groove disposed around at least two sides of a base thereof to form cantilevered extension portions that at least extend along a longitudinal length of the main body or the removable probe.

5. The tester of claim 1, wherein the socket comprises a right side sheath body and a left side sheath body that each extend from opposite sides of the socket outward away from the removable probe or the main body and then fold toward each other to define a receiving space in the socket to receive the mating protrusion.

6. The tester of claim 1, further comprising an alignment ridge disposed proximate to the socket, the alignment ridge extending radially outward from the removable probe or the main body in a plane substantially perpendicular to a longitudinal axis of the removable probe or the main body, the alignment ridge including a flat surface configured to abut a mating surface disposed proximate to the mating protrusion on the other of the removable probe or the main body.

7. The tester of claim 1, wherein the main body further comprises a probe support ridge extending radially outward from at least a portion of the main body and lying in a plane that is substantially perpendicular to a longitudinal axis of the main body.

8. The tester of claim 7, wherein the probe support ridge extends at least over a back panel of the main body and a side panel of the main body that is proximate to the removable probe when the removable probe is fixed to the main body via the latch assembly.

9. The tester of claim 7, wherein the probe support ridge comprises a cradle portion shaped to support a back portion of the removable probe when the removable probe is fixed to the main body via the latch assembly.

10. The tester of claim 7, wherein the probe support ridge comprises a cradle portion including a first portion that contacts one side of the removable probe and a second portion that simultaneously contacts a back side portion of the removable probe when the removable probe is fixed to the main body via the latch assembly.

11. The tester of claim 1, wherein each of the removable probe and the main body probe include corresponding lead tips, and wherein the lead tips of the removable probe and the main body probe are substantially even in a longitudinal direction when the removable probe is fixed to the main body via the latch assembly.

12. The tester of claim 1, wherein each of the removable probe and the main body probe include corresponding lead tips, and wherein the lead tips of the removable probe and the main body probe are disposed a predetermined distance from each other when the removable probe is fixed to the main body via the latch assembly.

13. The tester of claim 12, wherein the predetermined distance corresponds to a distance between receptacle slots for receiving power plugs.

14. A method of assembling a tester comprising:
providing a main body including a main body probe and a front panel including selectable options for selecting a tester function;
coupling a removable probe to the main body via a cord; and
providing a latch assembly to enable fixing of the removable probe to the main body, the latch assembly including a socket disposed on one of the removable probe or the main body and a mating protrusion disposed on the other of the removable probe or the main body, the mating protrusion comprising an arcuate groove disposed around at least two sides of a base thereof and being insertable into the socket.

15. The method of claim 14, wherein the mating protrusion forms cantilevered extension portions that at least extend along a longitudinal length of the main body or the removable probe.

16. The method of claim 15, wherein providing the latch assembly further comprises providing the socket to include a right side sheath body and a left side sheath body that each extend from opposite sides of the socket outward away from the removable probe or the main body and then fold toward each other to define a receiving space in the socket to receive the mating protrusion.

17. The method of claim 14, wherein the mating protrusion extends from a side of the removable probe or the main body.

18. The method of claim 14, further comprising inserting the mating protrusion into the socket via motion in a direction parallel to a longitudinal length of the main body.

19. A tester comprising:
a main body including a main body probe and a front panel including selectable options for selecting a tester function, wherein the main body has a longitudinal axis extending parallel to a longitudinal length of the main body; and
a removable probe coupled to the main body via a cord, wherein the removable probe has a longitudinal axis extending parallel to a longitudinal length of the removable probe,
wherein the removable probe is fixable to the main body via a latch assembly, the latch assembly including a socket disposed on one of the removable probe or the main body and a mating protrusion disposed on the other of the removable probe or the main body, the mating protrusion extending laterally outward from a side of the removable probe or the main body at an angle to the longitudinal axis of the removable probe or the main body and being insertable into the socket via motion in a direction parallel to the longitudinal length of the main body, and
wherein the main body further comprises a planar probe support ridge extending radially outward from at least a portion of the main body and lying in a plane that is substantially perpendicular to the longitudinal axis of the main body.

20. The tester of claim 19, wherein the probe support ridge extends at least over a back panel of the main body and a side panel of the main body that is proximate to the removable probe when the removable probe is fixed to the main body via the latch assembly.

21. The tester of claim 19, wherein the probe support ridge comprises a cradle portion shaped to support a back portion of the removable probe when the removable probe is fixed to the main body via the latch assembly.

22. The tester of claim 19, wherein the probe support ridge comprises a cradle portion including a first portion that contacts one side of the removable probe and a second portion that simultaneously contacts a back side portion of the removable probe when the removable probe is fixed to the main body via the latch assembly.

* * * * *